United States Patent [19]
Komori et al.

[11] Patent Number: 5,929,716
[45] Date of Patent: Jul. 27, 1999

[54] HIGH PERFORMANCE VOLTAGE CONTROLLED OSCILLATOR THAT IS COST EFFICIENT

[75] Inventors: Kenji Komori; Atsushi Hirabayashi, both of Tokyo; Kosuke Fujita, Kanagawa; Yoshito Kogure, Tokyo, all of Japan

[73] Assignee: Sony Corporation, Tokyo, Japan

[21] Appl. No.: 08/646,619

[22] Filed: May 8, 1996

[51] Int. Cl.$^6$ .................................. H03B 5/08; H03B 5/00
[52] U.S. Cl. ..................... 331/135; 331/117 R; 331/23; 329/325; 329/337; 348/726; 455/260; 455/263; 455/264
[58] Field of Search ...................... 455/262, 337, 455/260; 348/725, 731, 735, 726; 331/117 R, 108 C, 60, 177 V, 45, 135, 23, 167; 329/318, 319, 337, 320, 325

[56] References Cited

U.S. PATENT DOCUMENTS

| | | | |
|---|---|---|---|
| 5,187,450 | 2/1993 | Wagner et al. | 331/96 |
| 5,311,149 | 5/1994 | Wagner et al. | 331/1 A |
| 5,434,544 | 7/1995 | Van Veenendaal | 331/117 R |

*Primary Examiner*—Arnold Kinkead
*Attorney, Agent, or Firm*—Frommer Lawrence & Haug, LLP.; William S. Frommer

[57] ABSTRACT

A high-performance voltage controlled oscillator without use of variable capacitance (varicap) diodes which is easy in fabrication in an semiconductor IC form. The voltage controlled oscillator includes: a differential amplifier having a differential pair of transistors ($Q_1$, $Q_2$); an LC resonance circuit having a coil ($L_0$) and a capacitor ($C_0$); a phase shift circuit for receiving a differential output of the differential amplifier via a buffer of transistors ($Q_3$, $Q_4$) and for providing its output for the differential amplifier in a positive feedback mode; and a current control circuit for variably controlling an operating current (Ie) of the phase shift circuit according to a controlled voltage applied from a circuit other than those in the voltage controlled oscillator.

3 Claims, 5 Drawing Sheets

HIGH PERFORMANCE VOLTAGE CONTROLLED OSCILLATOR THAT IS COST EFFICIENT

BACKGROUND OF THE INVENTION

Field of The Invention

The present invention relates to a voltage controlled oscillator used for various purposes in a variety of electronic circuit equipment such as a radio receiver, television receiver, video tape recorder, or a mobile body communication equipment, and, particularly, relates to a technique achieving a high-performance voltage controlled oscillator with a simpler circuit construction.

Description of The Background Art

FIG. 1 typically shows a conventional voltage controlled oscillator.

As shown in FIG. 1, a differential amplifier is constituted by a differential pair of transistors $Q_1$ and $Q_2$ and collector resistors $R_0$ and $R_0$ respectively connected to collectors of these transistors. An LC resonance circuit constituted by a coil $L_0$, a capacitor $C_0$, and variable capacitance diodes (also called varicap diodes) $VC_1$ and $VC_2$ is connected between the differential output terminals of the differential amplifier. In addition, the coils $L_1$ and $L_2$ included in the LC resonance circuit are used to eliminate AC (Alternating Current) components of an input signal (controlled voltage) therein and have sufficiently large inductance values as compared with the coil $L_0$ and the capacitors $C_1$ and $C_2$ are used to eliminate DC (Direct Current) components of the input signal therein and have sufficiently large capacitance values as compared with the capacitors $C_0$ and $C_V$. In FIG. 1, $C_V$ denotes a capacitance value of each of the variable capacitance diodes $VC_1$ and $VC_2$ and is varied according to the controlled voltage (input signal) externally applied thereacross.

In addition, each differential output of the differential pair of transistors $Q_1$ and $Q_2$ is buffered by an emitter follower constituted by a transistor $Q_3$ and an emitter resistor $R_3$ and by an emitter follower constituted by a transistor $Q_4$ and an emitter resistor $R_4$ and is fedback into each base of the differential pair of transistors $Q_1$ and $Q_2$. This feedback becomes a positive feedback at a particular frequency so that the whole circuit shown in FIG. 1 is oscillated at a resonance frequency of the above-described LC resonance circuit. The resonance frequency $f_0$ of this circuit is given in an equation (1) of TABLE 1 and is varied according to the capacitance value $C_V$ of each of the variable capacitance diodes $VC_1$ and $VC_2$ varied according to the controlled voltage.

However, since, in the conventional voltage controlled oscillator, the variable capacitance diodes $VC_1$ and $VC_2$ are used to constitute the resonance circuit, numbers of parts to be externally attached to a semiconductor IC (Integrated Circuit) are increased so that an increased cost of the parts and an increase in an IC substrate area are brought about.

In addition, a mounting arrangement of the parts externally attached to the IC and an IC wired pattern provide causes of unnecessary radiations of electromagnetic waves from the above-described oscillator and causes of losing its stability of oscillation of the oscillator so that a difficulty in designing an IC substrate becomes extremely high.

Furthermore, since such a characteristic as a linearity in a frequency variation with respect to the controlled voltage is dependent upon capacitance variable characteristics of the variable capacitance diodes $VC_1$ and $VC_2$ to be used, characteristic deviations and temperature drifts in the individual variable capacitance diodes $V_C$, and $VC_2$ largely affect the performance of the oscillator. Therefore, in a case where a high-performance characteristic for such an oscillator as described above is demanded, the parts which can be used in the oscillator are limited and it becomes necessary to select the discrete parts so that a further increase in the costs of the parts is brought about.

SUMMARY OF THE INVENTION

With the above-described problems in mind, it is an object of the present invention to provide a high-performance voltage controlled oscillator without use of variable capacitance diodes and having a circuit construction which is easy in manufacture thereof in a semiconductor IC form.

The above-described object can be achieved by providing a voltage controlled oscillator comprising:

a) a differential amplifier;

b) an LC resonance circuit having a coil and a capacitor and connected across differential output terminals of said differential amplifier;

c) a phase shift circuit for receiving differential outputs of said differential amplifier via a buffer and for providing its output in a positive feedback mode for the differential amplifier; and d) a current control circuit for variably controlling an operating current of said phase shift circuit according to the controlled voltage applied thereto from a circuit other than the voltage controlled oscillator.

The above-described object can also be achieved by an FM detector comprising:

a) a phase discriminator to which a modulated wave is inputted;

b) a loop filter which limits an output of the phase discriminator to a frequency band to be passed therethrough;

c) a voltage controlled oscillator having: a differential amplifier; an LC resonance circuit having a coil and a capacitor and connected across differential output terminals of the differential amplifier; a phase shift circuit for receiving differential outputs of said differential amplifier via a buffer and for providing its output in a positive feedback mode for the differential amplifier; and a current control circuit for variably controlling an operating current of said phase shift circuit according to the controlled voltage applied thereto from said loop filter, an output of said current control circuit being supplied to said phase discriminator.

DESCRIPTION OF THE PREFERRED EMBODIMENT

Reference will hereinafter be made to the drawings in order to facilitate a better understanding of the present invention.

Figure 1:
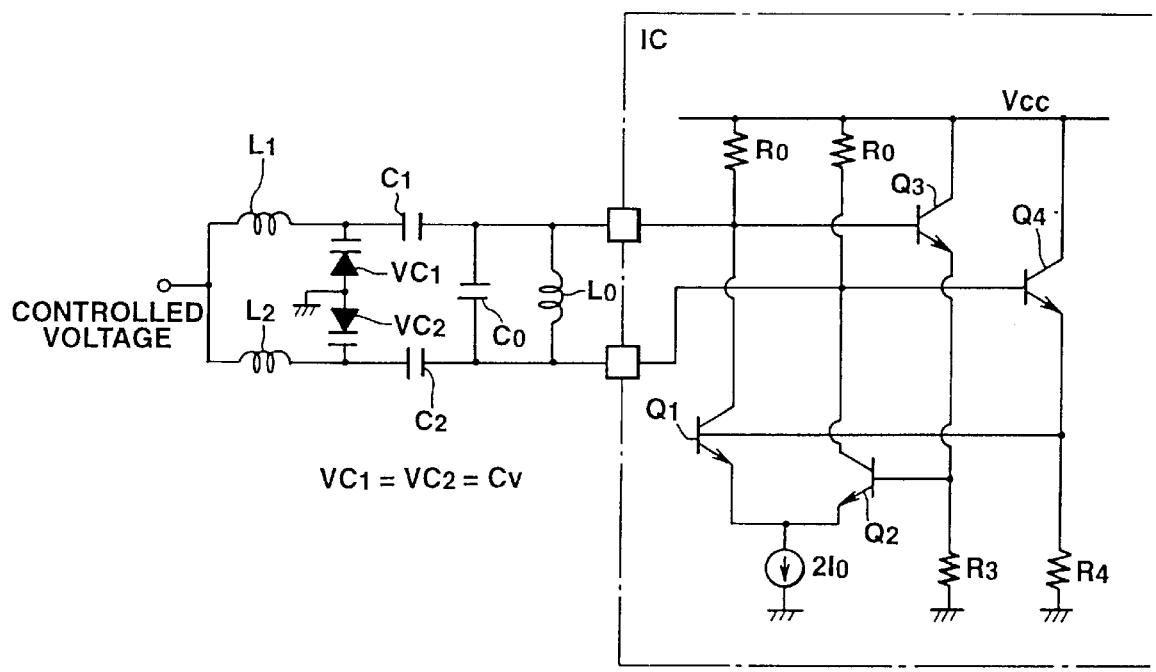
FIG. 1 is a circuit wiring diagram of a conventional voltage controlled oscillator described in the BACKGROUND OF THE INVENTION.

FIG. 1 has already been described in the

BACKGROUND OF THE INVENTION.

Figure 2:
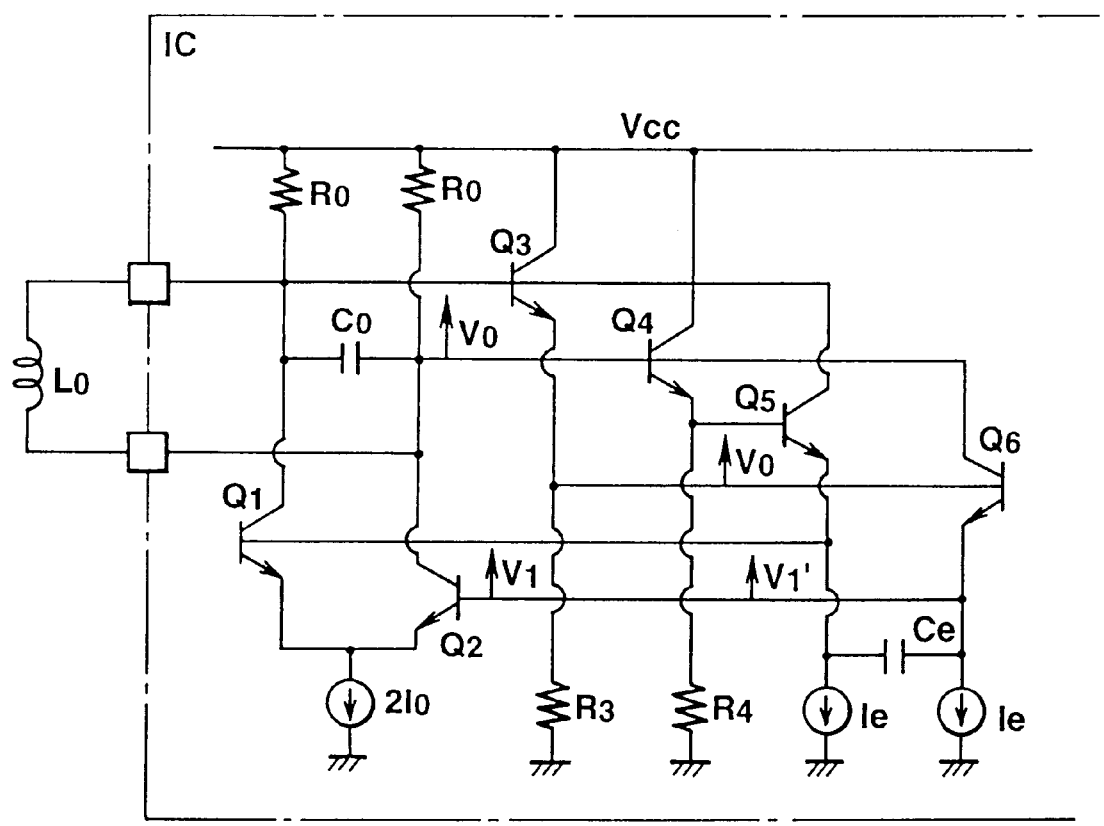
FIG. 2 is a circuit block diagram of a basic circuit of a voltage controlled oscillator in a preferred embodiment according to the present invention.

FIG. 2 is a basic circuit wiring diagram of a voltage controlled oscillator in a preferred embodiment according to the present invention.

A differential amplifier is constituted by a (differential) pair of (differential) transistors $Q_1$, and $Q_2$ and associated collector resistors $R_0$ and $R_0$, as shown in FIG. 2.

An LC resonance circuit constituted by a coil $L_0$ and a capacitor $C_0$ is connected between differential output terminals of the differential amplifier. The coil $L_0$ is connected in parallel to the capacitor $C_0$. It is noted that the capacitor $C_0$ is incorporated into a semiconductor IC (Integrated Circuit) and only the coil $L_0$ is a part externally attached to the IC.

In addition, differential output voltages $V_0$ and $V_0$ of the differential amplifier constituted by the differential pair of transistors $Q_1$, and $Q_2$ are buffered by an emitter follower (transistor amplifier) constituted by a transistor $Q_3$ and an emitter resistor $R_3$ and by another emitter follower (transistor amplifier) constituted by a transistor $Q_4$ and an emitter resistor $R_4$, respectively. The buffered outputs are applied to bases of another differential pair of transistors $Q_5$ and $Q_6$, respectively.

An LPF (Low Pass Filter) is constituted by each of the pair of differential transistors $Q_5$ and $Q_6$, an emitter resistor re determined according to a controlled emitter current $I_e$ as shown in an equation of (2) in TABLE 1 and a capacitor Ce connected across emitters of the differential pair of transistors $Q_5$ and $Q_6$ (referred to as inter-emitter capacitor), this LPF shifting a phase of the emitter voltage of a left-handed one $Q_6$ of the differential pair of transistors $Q_5$ and $Q_6$. The LPF, with principal elements Q5 and Q6, is hereinafter referred to as a phase shift circuit. Each output (voltage) V'$_1$ of the phase shift circuit is fedback to the corresponding one of the bases of the differential pair of transistors $Q_1$ and $Q_2$. Collector currents of the differential pair of transistors $Q_5$ and $Q_6$ are also fedback to the LC resonance circuit. In the equation (2), k denotes a Boltsmann's constant, T denotes an absolute temperature, q denotes an electric charge of a carrier.

Suppose that an input conductance of the differential pair of transistors $Q_1$, and $Q_2$ is denoted by gm. A transfer function $T(j\omega)$ from a voltage difference $V_1$, between the bases of the differential pair of transistors $Q_1$, and $Q_2$ to the output voltage V'$_1$ of the phase shift circuit is expressed as an equation (3) described in TABLE 1. A positive feedback is resulted if an imaginary part of the transfer function of the equation (3) indicates zero, i.e., a real part of a denominator in the equation (3) indicates zero. The resonance frequency $\omega$ 0 at this time is indicated as shown in an equation (4) of TABLE 1. Suppose that the inter-emitter capacitor Ce of the phase shift circuit is twice as large as the capacitor $C_0$ of the LC resonance circuit as given in an equation (5) of TABLE 1. When the emitter resistor re of the phase shift circuit is substituted by the emitter current Ie according to the equation (2), an oscillation angular frequency $\omega$ 0 is given in an equation (6) of TABLE 2 so that it will be appreciated that the oscillation angular frequency is varied according to the emitter current Ie.

Figure 3:
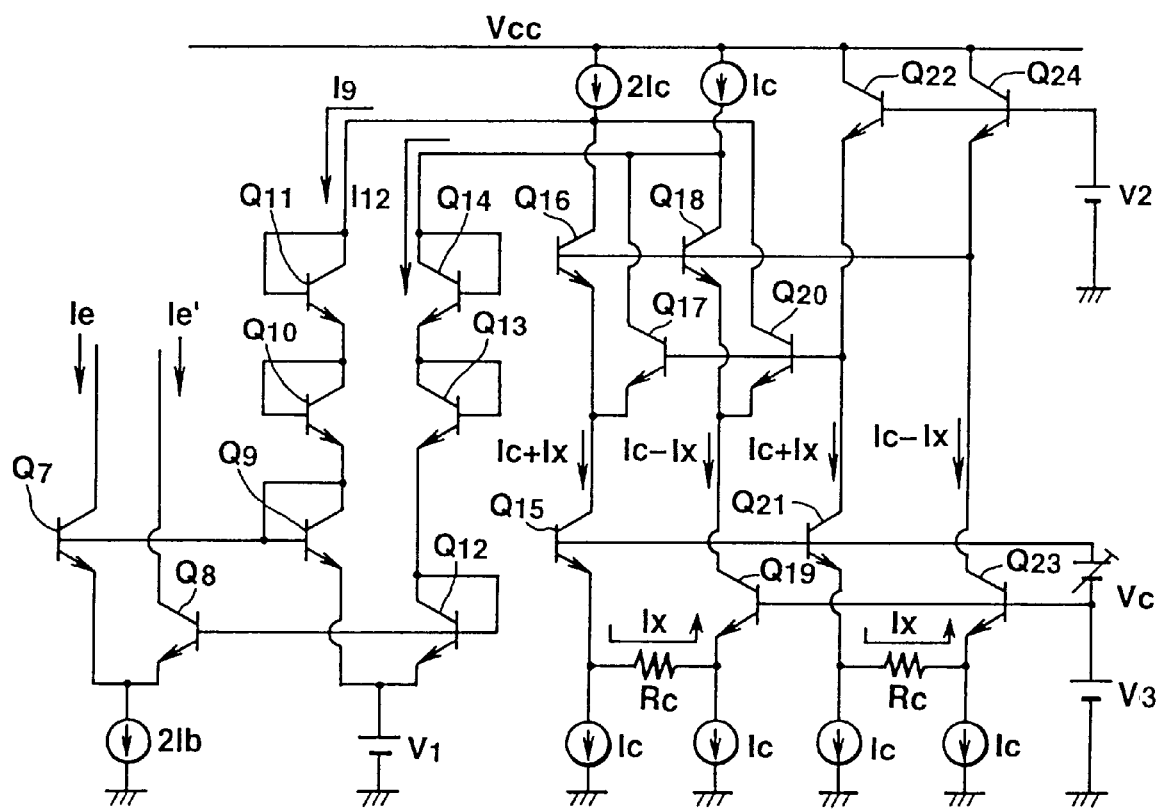
FIG. 3 is a wiring diagram of a control circuit for providing a current $I_e$ in FIG. 2.

<Control Circuit of Emitter current Ie in FIG. 3>

FIG. 3 shows a control circuit to variably control each emitter current Ie of the differential pair of transistors $Q_5$ and $Q_6$ constituting the phase shift circuit in FIG. 2.

In FIG. 3, a controlled voltage Vc is provided as a voltage difference between bases of a differential pair of transistors $Q_{15}$ and $Q_{19}$ and between bases of another differential pair of transistors $Q_{21}$ and $Q_{23}$ (the base of the transistor $Q_{15}$ is connected to the base of the transistor $Q_{21}$ and the base of the transistor $Q_{19}$ is connected to the base of the transistor $Q_{23}$) so that differences 2Ix of collector currents for the differential pair of transistors $Q_{15}$ and $Q_{19}$ ($Q_{21}$, $Q_{23}$) are developed. This current Ix is a value of the controlled voltage Vc divided by an emitter resistor Rc connected between emitters of the differential pair of transistors $Q_{15}$ and $Q_{19}$ ($Q_{21}$ and $Q_{23}$), as given in an equation (7) of TABLE 2. Emitter currents Ic and Ic of the differential pair of transistors $Q_{15}$, $Q_{19}$ are provided by constant current sources connected between emitters of both transistor5s $Q_{15}$ and $Q_{19}$ ($Q_{21}$ and $Q_{23}$). A collector current (Ic+Ix) of the transistor $Q_{21}$ and a collector current (Ic−Ix) of the transistor $Q_{23}$ are caused to flow as emitter currents of base grounded transistors $Q_{22}$ and $Q_{24}$, respectively. In addition, a collector current (Ic+Ix) of the transistor $Q_{15}$ is caused to flow as emitter currents of a balance pair of transistors $Q_{16}$ and $Q_{17}$ and a collector current (Ic−Ix) of the transistor $Q_{19}$ is caused to flow as emitter currents of another balance pair of transistors $Q_{18}$ and $Q_{20}$. A relationship between base-emitter voltages $V_{BE16}$, $V_{BE17}$, $V_{BE22}$, and $V_{BE24}$ of the respective transistors $Q_{16}$, $Q_{17}$, $Q_{22}$, and $Q_{24}$ is expressed in an equation (8) of TABLE 2. The respective base-emitter voltages $V_{BE16}$, $V_{BE17}$, $V_{BE22}$, and $V_{BE24}$ are provided as described in an equation (9) of TABLE 2. Therefore, if both equations of (8) and (9) are solved, collector currents $I_{16}$ and $I_{17}$ of the respective transistors $Q_{16}$ and $Q_{17}$ are given as an equation (10) of TABLE 2.

Similarly, each collector current $I_{18}$ and $I_{20}$ of the transistors $Q_{18}$ and $Q_{20}$ is given as an equation (11) of TABLE 3.

The remainder (difference) of a current $I_9$ derived by subtracting added currents ($I_{16}+I_{20}$) from 2Ic is expressed in an equation (12) of TABLE 3.

Similarly, the remainder of a current $I_{12}$ derived by subtracting the added currents ($I_{17}+I_{18}$) from Ic is also given in the equation (12) of TABLE 3.

The current $I_9$ is caused to flow into the transistor $Q_9$ via voltage shifting transistors $Q_1$ and $Q_1$. The current $I_{12}$ is caused to flow into the transistor $Q_{12}$ via voltage shifting transistors $Q_{13}$ and $Q_{11}$.

Since the same relationship as the equation (8) is established for each transistor $Q_7$, $Q_8$, $Q_9$, and $Q_{12}$, the collector current Ie of the transistor $Q_7$ is given as an equation (13) of TABLE 3.

As appreciated from the equation (13), each emitter current Ie of the differential pair of transistors $Q_5$ and $Q_6$ in the phase shift circuit are variably controlled according to the controlled voltage Vc as shown in FIG. 3. As described before, when each emitter current Ie is varied, the oscillation angular frequency $\omega$ 0 of the oscillator shown in FIG. 2 is varied as given in the equation (6). In other words, the oscillation frequency of the voltage controlled oscillator is variably controlled according to the controlled voltage Vc.

In FIG. 3, Vcc denotes a bias voltage supply, $V_1$, $V_2$ and $V_3$ denote respective voltage supplies.

Figure 4:
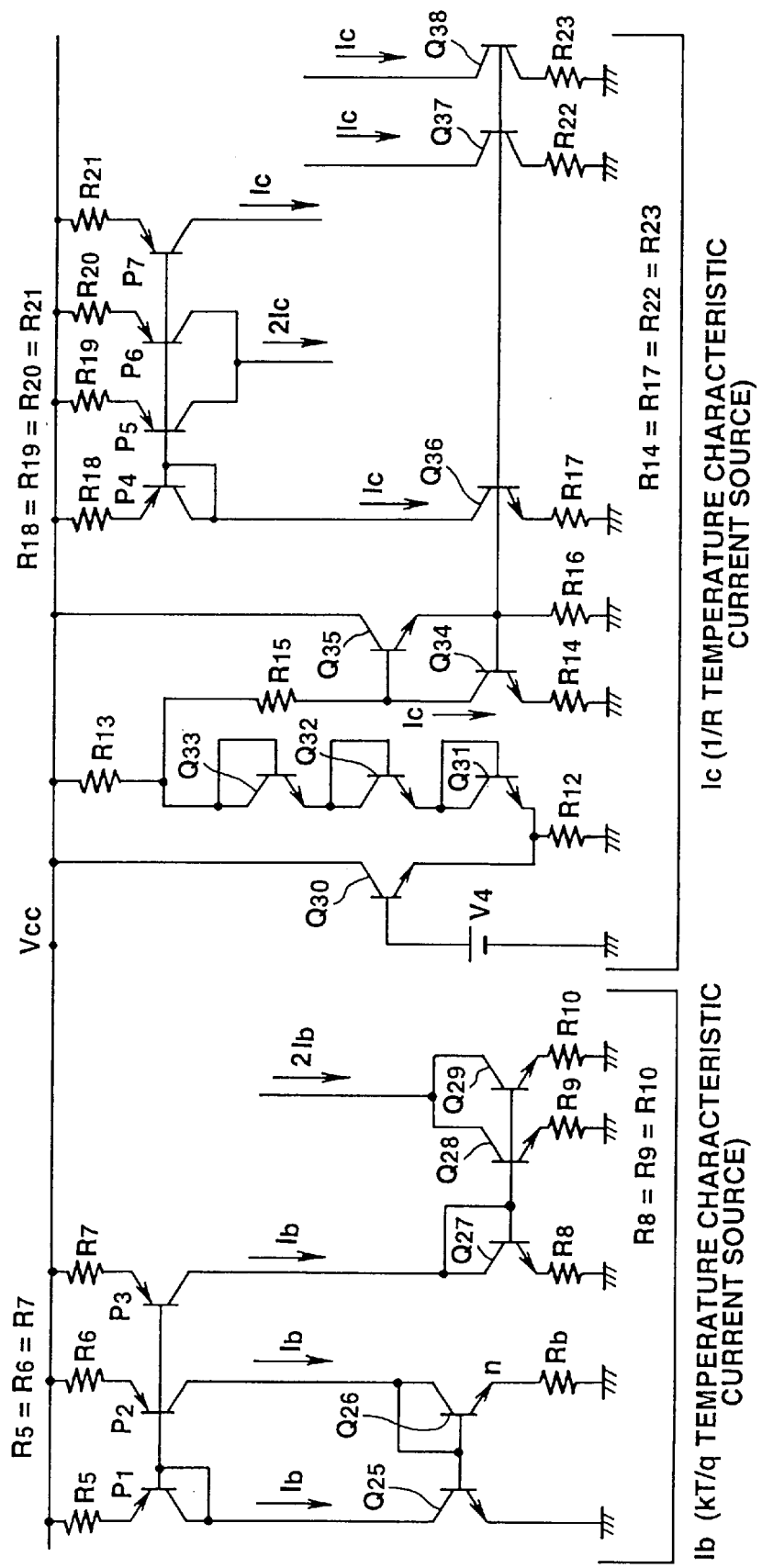
FIG. 4 is a wiring diagram of a current source with temperature characteristic canceling circuits for providing currents of $I_c$ and $I_b$ in FIG. 3.

<Temperature Characteristic Canceling Circuit of FIG. 4>

FIG. 4 shows a circuit construction of the constant current sources providing the constant currents of $I_c$, $2I_c$, and $2I_b$ in the Ie control circuit shown in FIG. 3.

The constant current sources are provided with circuits to cancel the temperature characteristics of the oscillator shown in FIG. 2.

In details, in FIG. 4, a temperature characteristic cancellation (canceling) circuit providing the temperature characteristic of kT/q is added to the constant current supply circuit generating the constant current $2I_b$ and a temperature characteristic cancellation (canceling) circuit providing the temperature characteristic of 1/R is added to the constant current supply circuits generating the constant currents $I_c$ and $2I_c$.

Transistors $P_1$, $P_2$, and $P_3$ and resistors $R_5$, $R_6$, and $R_7$ constitute a current mirror circuit so that collector currents of the other PNP transistors $P_2$ and $P_3$ are made equal to a collector current of the transistor $P_1$. Transistors $Q_{25}$ and $Q_{26}$ and the resistor $R_b$ constitute, so called, a band cap reference circuit. An emitter size ratio n between the emitters of the transistors $Q_{25}$ and $Q_{26}$ determines the current $I_b$ having the temperature characteristic of kT/q as given in an equation (14) of TABLE 3. This constant current $I_b$ is folded back (mirrored) into another current mirror circuit. In the other current mirror circuit constituted by transistors $Q_{27}$, $Q_{28}$, and $Q_{29}$ and resistors $R_8$, $R_9$, and $R_{10}$, the collector current of the transistor $Q_{27}$ (namely, derived from the transistor $P_3$) and the collector current of the transistor $Q_{28}$ which is equal to the collector current of the transistor $Q_{27}$) are added to derive the doubled collector current of $2I_b$ which serves as the constant current (power supply) source $2I_b$ in FIG. 3.

In addition, a reference voltage generator constituted by transistors $Q_{30}$ (including a base voltage supply $V_4$), $Q_{31}$, $Q_{32}$, $Q_{33}$, $Q_{34}$, and $Q_{35}$, a transistor $Q_{36}$, and a resistor $R_{17}$ cause a constant current Ic to flow into the transistor $Q_{36}$. This current Ic has the temperature characteristic of 1/R as expressed in an equation (15) of TABLE 3. This current Ic receives a mirror effect through a PNP current mirror circuit (constituted by transistors $P_4$, $P_5$, $P_6$, and $P_7$ and resistors $R_{18}$, $R_{19}$, $R_{20}$ and $R_{21}$) and through an NPN current mirror circuit (constituted by the transistors $Q_{37}$ and $Q_{38}$ and resistors $R_{22}$ and $R_{23}$) to develop the constant currents of Ic and 2Ic, the constant currents Ic and 2Ic being the constant current (power) sources of Ic and 2Ic shown in FIG. 3.

Then, by substituting the equations of (14) and (15) into the equation (13), an equation of (16) of TABLE 3 is established.

Furthermore, an equation (17) of TABLE 3 is a substitution result of an equation (derived by substituting the equation (2) into the equation (6)) into the equation (16).

As shown in the equation (17), a term of controlled voltage Vc is outside a calculation enclosed by a root so that the variation of the controlled voltage Vc provides a linear variation characteristic for the oscillation frequency. Consequently, such a characteristic as the linearity of the frequency variation with respect to the controlled voltage Vc is superior. In addition, since the terms of resistors in the equation (17) are constant ratio and the temperature coefficient is canceled as shown in the equation (17), such a temperature variation characteristic as the temperature drift in the oscillation frequency is superior. That is to say, the oscillation frequency of the voltage controlled oscillator according to the present invention is not affected by the temperature drift.

<Application Example of Voltage Controlled Oscillator>

Figure 5:
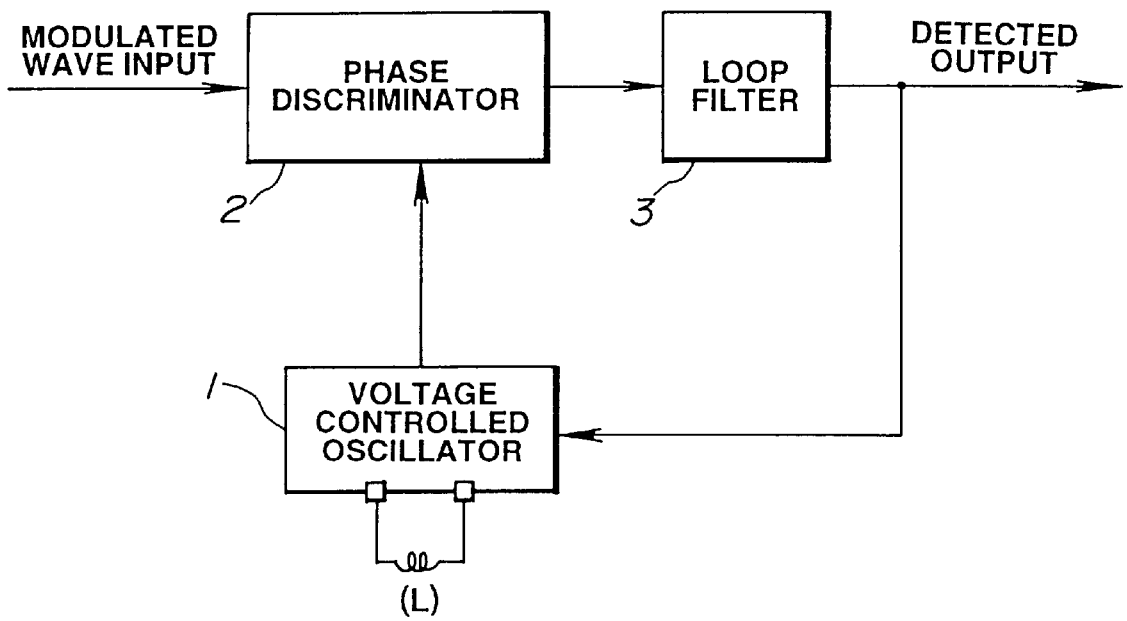
FIG. 5 is a circuit block diagram of an application example of the voltage controlled oscillator shown in FIG. 2 in an FM detector of a satellite broadcasting receiver.

FIG. 5 shows an example of application of the voltage controlled oscillator according to the present invention to a PLL (Phase Locked Loop) oscillator in an FM (Frequency Modulated) detector (modulator) (video detector) installed in a satellite broadcasting receiver.

In FIG. 5, a phase discriminator 2 serves to make a phase discrimination of an input modulated wave and an output of the voltage controlled oscillator 1 and a loop filter 3 eliminates high frequency components from an output signal of the phase discriminator 2 and feeds back the controlled voltage to the voltage controlled oscillator 1 so that an output of the loop filter 3 provides the same frequency as that of the input modulated wave. Consequently, the controlled voltage provides the detector output. When the voltage controlled oscillator 1 according to the present invention is used in the FM detector of the satellite broadcasting receiver shown in FIG. 5, the frequency variation characteristic with respect to the controlled voltage provides directly suppression characteristics against a distortion in the detected output waveform and a beat therein so that it can be expected that the use of voltage controlled oscillator according to the present invention in the FM detector provides a remarkably improved performance for the satellite broadcasting receiver.

It is noted that (L) in FIG. 5 corresponds to $L_0$ shown in FIG. 2.

Figure 6:
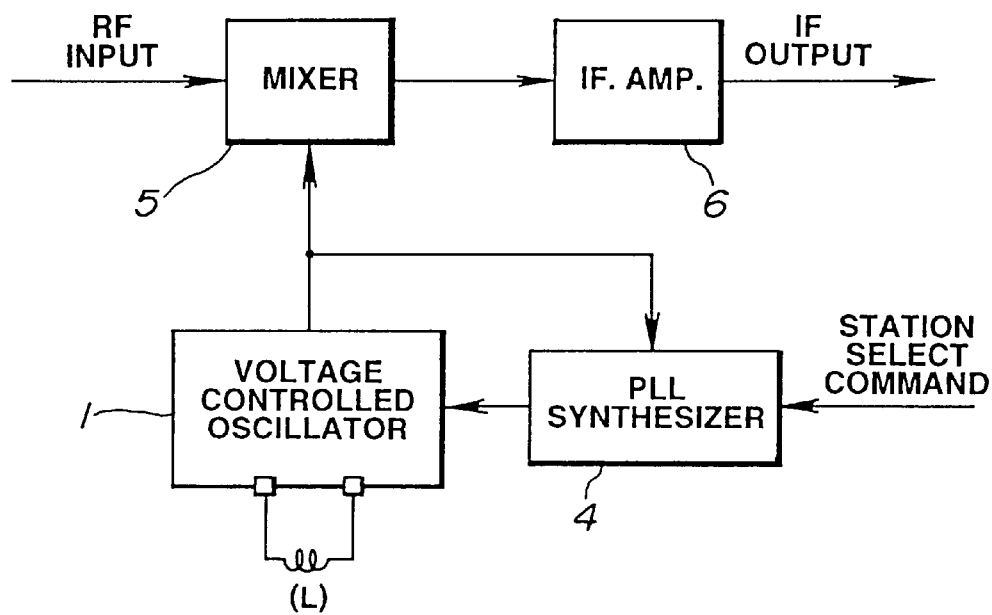
FIG. 6 is a circuit block diagram of another application example of the voltage controlled oscillator shown in FIG. 2 in a station selection circuit of a television receiver.

FIG. 6 shows another example of the voltage controlled oscillator 1 according to the present invention to a station selecting local oscillator in a television receiver.

When a station select command is transmitted from, such as a microcomputer (not shown) to a PLL synthesizer 4, a controlled voltage of the PLL synthesizer 4 serves to control the oscillation of the voltage controlled oscillator 1. The oscillation output of the voltage controlled oscillator 1 and an RF (Radio Frequency) input are mixed at a mixer 5. An output of the mixer 5 provides an IF (Intermediate Frequency) output via an IF amplifier 5. When the voltage controlled oscillator according to the present invention is used in the application example shown in FIG. 6, reductions in the manufacturing cost of the TV receiver and in the IC substrate area can be expected. It is noted that (L) shown in FIG. 6 corresponds to $L_0$ shown in FIG. 2.

The voltage controlled oscillator is used in a variety of electronic circuit equipment such as a station selecting local oscillator in a radio receiver, a modulation-demodulation oscillator in a mobile body communication equipment, a station selecting local oscillator in a video (tape) recorder, and an oscillator for RF modulator. It is of course that the voltage controlled oscillator according to the present invention is applicable to such oscillators as described above.

Since, in the voltage controlled oscillator according to the present invention, the voltage controlled oscillator can be constructed without use of such variable capacitance elements as variable capacitance diodes, the reduction of the number of parts can be achieved and reductions of part costs (manufacturing cost) and the IC substrate area can also be achieved.

Various advantages can be achieved by the voltage controlled oscillator according to the present invention.

What is claimed is:

1. An FM detector comprising:
   a) a phase discriminator to which a modulated wave is inputted;
   b) a loop filter which limits an output of the phase discriminator to a frequency band to be passed therethrough;

c) a voltage controlled oscillator having: a differential amplifier; an LC resonance circuit having a coil and a capacitor and connected across differential output terminals of the differential amplifier; a phase shift circuit for receiving differential outputs of said differential amplifier via a buffer and for providing its output in a positive feedback mode for the differential amplifier, said phase shift circuit including a pair of emitter follower transistors; and a current control circuit for variably controlling an operating current of said phase shift circuit according to the controlled voltage applied thereto from said loop filter, said operating current being applied to at least one of the respective emitters of said emitter follower transistors, and the oscillation frequency of said voltage controlled oscillator varying according to said operating current and apart from any other currents or voltages within said oscillator,
wherein an output of said voltage controlled oscillator is supplied to said phase discriminator.

2. A voltage controlled oscillator comprising:

a) a differential amplifier;

b) an LC resonance circuit having a coil and a capacitor and connected across differential output terminals of said differential amplifier;

c) a phase shift circuit for receiving differential outputs of said differential amplifier via a buffer and for providing its output in a positive feedback mode for the differential amplifier, said phase shift circuit including a pair of emitter follower transistor amplifiers and a phase shift capacitor connected between emitters of said pair of emitter follower transistor amplifiers, collector currents of said pair of emitter follower transistor amplifiers being fed back to said LC resonance circuit; and d) a current control circuit for variably controlling an operating current of said phase shift circuit according to a controlled voltage applied thereto from a circuit other than the voltage controlled oscillator, wherein said operating current is applied to at least one of the respective emitters of said emitter follower transistors, and wherein the oscillation frequency of said voltage controlled oscillator varies according to said operating current and apart from any other currents or voltages within said oscillator.

3. A voltage controlled oscillator comprising:

a) a differential amplifier;

b) an LC resonance circuit having a coil and a capacitor and connected across differential output terminals of said differential amplifier;

c) a phase shift circuit for receiving differential outputs of said differential amplifier via a buffer and for providing its output in a positive feedback mode for the differential amplifier, said phase shift circuit including a pair of emitter follower transistors; and d) a current control circuit for variably controlling an operating current of said phase shift circuit according to a controlled voltage applied thereto from a circuit other than the voltage controlled oscillator, wherein said operating current is applied to at least one of the respective emitters of said emitter follower transistors, and wherein the oscillation frequency of said voltage controlled oscillator varies according to said operating current and apart from any other currents or voltages within said oscillator.

* * * * *